United States Patent
Hou et al.

(10) Patent No.: US 9,059,391 B2
(45) Date of Patent: Jun. 16, 2015

(54) SELF-RECTIFYING RRAM CELL STRUCTURE AND 3D CROSSBAR ARRAY ARCHITECTURE THEREOF

(71) Applicant: Winbond Electronics Corp., Taichung (TW)

(72) Inventors: Tuo-Hung Hou, Hsinchu (TW); Chung-Wei Hsu, Taitung (TW); I-Ting Wang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 162 days.

(21) Appl. No.: 14/025,299

(22) Filed: Sep. 12, 2013

(65) Prior Publication Data

US 2014/0158967 A1    Jun. 12, 2014

Related U.S. Application Data

(60) Provisional application No. 61/735,397, filed on Dec. 10, 2012.

(51) Int. Cl.
| | |
|---|---|
| *H01L 29/02* | (2006.01) |
| *H01L 45/00* | (2006.01) |
| *H01L 27/24* | (2006.01) |

(52) U.S. Cl.
CPC ............ *H01L 45/04* (2013.01); *H01L 45/1233* (2013.01); *H01L 45/146* (2013.01); *H01L 45/1633* (2013.01); *H01L 27/249* (2013.01)

(58) Field of Classification Search
CPC ..... H01L 45/1253; H01L 43/02; H01L 45/06; H01L 45/122; H01L 45/146; H01L 27/0886; H01L 27/2463; H01L 27/2481; H01L 45/08; H01L 45/1233; H01L 45/145; H01L 27/0207; H01L 27/11582; H01L 29/66666

USPC ............... 257/2–5, 537, E45.002, E27.009; 438/382, 482

See application file for complete search history.

(56) References Cited

FOREIGN PATENT DOCUMENTS

| JP | 2010 016075 | 1/2010 |
|---|---|---|
| JP | 2010-16075 A | 1/2010 |
| JP | 2011-520265 A | 7/2011 |
| KR | 10-2011-0015579 | 2/2011 |
| WO | WO 2009/134677 A2 | 11/2009 |
| WO | WO 2009/135072 A2 | 11/2009 |
| WO | WO 2009 154266 | 12/2009 |
| WO | WO 2009/154266 A1 | 12/2009 |

OTHER PUBLICATIONS

Notice of Reasons for Rejectionn issued in counterpart Japanese Application No. 2013-252387.
Office Action issued on Nov. 11, 2014 by the Japanese Patent Office in corresponding JP Patent Application No. 2013-252387 and an English language translation thereof.
Notice to Submit Response issued in counterpart Korean Patent Application No. 10-2013-0137204.
Korean Office Action issued Dec. 31, 2014 in corresponding Korean patent application No. 10-2013-0137204, 7 pages.

*Primary Examiner* — Mark A Laurenzi
(74) *Attorney, Agent, or Firm* — Muncy, Geissler, Olds & Lowe, P.C.

(57) ABSTRACT

The present disclosure provides a self-rectifying RRAM, including: a first electrode layer formed of a first metal element; a second electrode layer formed of a second metal element different from the first metal element; and a first resistive-switching layer and a second resistive-switching layer sandwiched between the first electrode layer and the second electrode layer, wherein the first resistive-switching layer and the second switching layer form an ohmic contact, and the first resistive-switching layer has a first bandgap lower than a second bandgap of the second resistive-switching layer. Furthermore, an RRAM 3D crossbar array architecture is also provided.

18 Claims, 4 Drawing Sheets

US 9,059,391 B2

SELF-RECTIFYING RRAM CELL STRUCTURE AND 3D CROSSBAR ARRAY ARCHITECTURE THEREOF

CROSS REFERENCE TO RELATED APPLICATIONS

This application claims the benefit of U.S. Provisional Application No. 61/735,397 filed on Dec. 10, 2012, entitled "SELF RECTIFYING RESISTIVE SWITCHING MEMORY" which application is hereby incorporated herein by reference.

BACKGROUND

1. Field of the Disclosure

The present disclosure relates to a memory device, and in particular, relates to resistive random access memory (RRAM) and a 3D crossbar array thereof.

2. Description of the Related Art

As the functionality of integrated chips increases, the need for more memory also increases. Designers have been looking to decrease the size of the memory element and stack more memory elements in a unit area to achieve greater capacity and lower costs per bit. In the past few decades, the aggressive shrinkage of memory elements is due to lithography technique advancements. A flash memory has been widely used as large-capacity and inexpensive nonvolatile memory which can store data when it is powered off. In addition, the flash memory can achieve high density by using 3D arrays, such as using vertical NAND cell stacking. However, it has been found that further miniaturization of the flash memory is limited as costs are increasing.

Designers are now looking at next generation nonvolatile memories such as MRAMs (Magnetoresistive Random Access Memory), PCRAMs (Phase Change Random Access Memory), CBRAMs (Conductive Bridging Random Access Memory) and RRAMs (Resistive Random Access Memory), to increase writing speed and decrease power consumption. Among the nonvolatile memories, the RRAM has the most potential to replace flash memories due to its simple structure, simple crossbar array and ability for low-temperature fabrication. A unit element of the RRAM is composed of only an insulator with two metal electrodes.

Although the RRAM crossbar array architecture is simple, there are still many problems needed to be overcome for fabrication, especially for three-dimensional (3D) crossbar array architectures. Without a vertical 3D architecture, the RRAM will most likely not be able to compete with 3D NAND memories in terms of bit cost for mass data storage.

The RRAM crossbar array architectures based on resistive-switching elements theoretically allows for the smallest cell size of $4F^2$ where F is the minimum feature size, and the low-temperature fabrication enables stacking of memory arrays three-dimensionally, for unprecedented high integration density. However, in the 1R structure (having a resistive element only), undesired sneak current through neighboring unselected cells significantly deteriorates the read margin, and limits the maximum size of the crossbar array to below 64 bits. This problem can be mitigated by additional nonlinear selection devices in series with the resistive-switching elements. Some cell structures, such as one diode-one resistor (1D1R), one bipolar selector-one resistor (1S1R), one MOSFET transistor-one resistor (1T1R), and one bipolar junction transistor-one resistor 1BJT1R cell structures, have been developed. Among the cell structures, the 1T1R and 1BJT1R cell structures are undesirable because of the complicated and high-temperature fabrication requirements of MOSFETs and BJTs, while the complementary resistive-switching (CRS) cell structure suffers from the issue of destructive read. Hence, the 1D1R and 1S1R cell structures appear to be the leading contenders for the 3D crossbar array architectures.

However, the 3D crossbar array architectures of the 1D1R or 1S1R cell structures still cannot be successfully fabricated. The 1D1R and 1S1R cell structures are basically formed of a metal-insulator-metal-insulator-metal (MIMIM) structure. FIG. 1 shows an exemplary scheme of an ideal RRAM 3D crossbar array architecture including 1D1R and 1S1R cell stacked structures. The MIMIM structure of the 1D1R and 1S1R cell structures is formed between the conductive lines 102 and 104 along the horizontal longitude 106 perpendicular to sidewalls of the conductive lines 102 and 104. However, the RRAM 3D crossbar array architecture is usually formed within a semiconductor substrate. After the formation of the conductive lines 102, lithography processes only can be performed from the direction 110. Performing the lithography processes from the direction 110 could not form the patterned metal layer 108 as shown in FIG. 1, which eliminates application for the 3D crossbar array architectures through the 1D1R and 1S1R cell structures.

SUMMARY

One of the broader forms of an embodiment of the present disclosure involve a self-rectifying RRAM, including: a first electrode layer formed of a first metal element; a second electrode layer formed of a second metal element different from the first metal element; and a first resistive-switching layer and a second resistive-switching layer sandwiched between the first electrode layer and the second electrode layer, wherein the first resistive-switching layer and the second switching layer form an ohmic contact, and the first resistive-switching layer has a first bandgap lower than a second bandgap of the second resistive-switching layer.

Another broader form of an embodiment of the present disclosure involves an RRAM 3D crossbar array architecture, including: a group of vertical parallel conductive lines formed of a first metal element; a group of horizontal parallel conducive lines formed of a second metal element different from the first metal element; a first resistive-switching layer formed on sidewalls of the group of vertical parallel conductive lines; and a second resistive-switching layer formed on sidewalls of the group of vertical parallel conductive lines, wherein the first resistive-switching layer and the second resistive-switching layer form ohmic contacts at the intersections of the group of vertical parallel conductive lines and the group of horizontal parallel conducive lines, and the first resistive-switching layer has a first bandgap lower than a second bandgap of the second resistive-switching layer.

A detailed description is given in the following embodiments with reference to the accompanying drawings.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1:
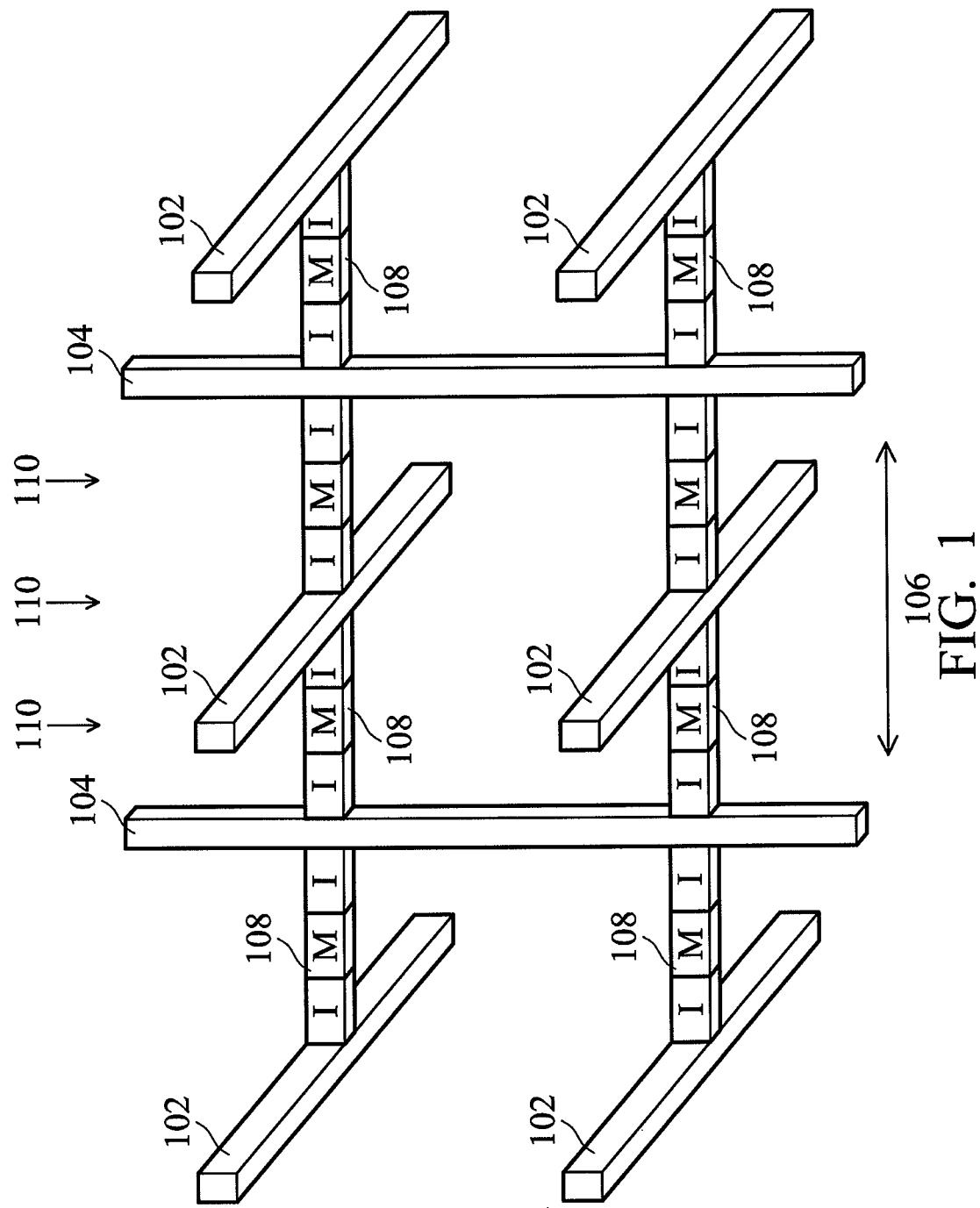
FIG. 1 shows an exemplary scheme of an ideal RRAM 3D crossbar array architecture with 1D1R or 1S1R cell structures.

The following description is of the best-contemplated mode of carrying out the disclosure. This description is made for the purpose of illustrating the general principles of the disclosure and should not be taken in a limiting sense. These are, of course, merely examples and are not intended to be limited. For example, the formation of a first feature over, above, below, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides an RRAM cell structure without a selection device while showing self-rectifying or self-selecting characteristics similar to the RRAM having the 1D1R or 1S1R cell structure. In addition, the RRAM cell structure of the present disclosure may be applicable with the 3D RRAM crossbar array architecture.

Figure 2:
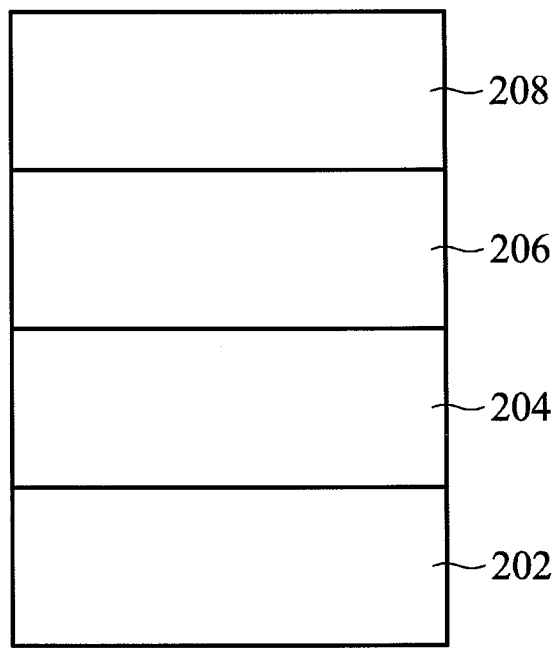
FIG. 2 shows a cell structure of the present disclosure of a resistive random access memory.

FIG. 2 shows a cell structure of the present disclosure of a resistive random access memory. A memory cell structure of the RRAM includes a first electrode layer 202, a first resistive-switching layer 204, a second resistive-switching layer 206 and a second electrode layer 208. The first resistive-switching layer 204 and the second resistive-switching layer 206 may be sandwiched between the first electrode layer 202 and the second electrode layer 208. In some embodiments, the first resistive-switching layer 204 may adjacently connect to the first electrode layer 202, and the second electrode layer 206 may adjacently connect to the second electrode layer 208. The first resistive-switching layer 204 may directly contact to the second resistive-switching layer 206 and forms an ohmic contact.

The first electrode layer 202 may comprise a metal element. In an embodiment, an oxide of the metal element of the first electrode layer 202 may be an insulator material having a relative lower bandgap. The second electrode layer 208 may comprise another metal element different from the element of the first electrode layer 202. In addition, an oxide of another metal element of the second electrode layer may be an insulator having a relative higher bandgap. The metal elements of the first electrode layer 202 and the second electrode layer 208 may be selected from the group consisting of Ti, Ta, Ni, Cu, W, Hf, Zr, Nb, Y, Zn, Co, Al, Si, Ge and their alloys. For example, in an embodiment, the first electrode layer 202 may be formed of Ti, and the second electrode layer 208 may be formed of Ta. In another embodiment, the first electrode layer 202 may be formed of Ta, and the second electrode layer 208 may be formed of Hf.

The first resistive-switching layer 204 may be formed of an insulator having a first bandgap. The second resistive-switching layer 206 may be an insulator, having a second bandgap higher than the first bandgap of the first resistive-switching layer 204. In an embodiment, the first bandgap and the second bandgap may be between about 1 eV and about 9 eV. In some embodiments, the second bandgap may be higher than the first bandgap by more than 0.5 eV.

In some embodiments, the first resistive-switching layer 204 may be formed of an oxide of the metal element of the first electrode layer 202, and the second resistive-switching layer 206 may be an oxide of the metal element of the second electrode layer 208. For example, in an embodiment, the first resistive-switching layer 204 may be formed of $TiO_2$ when the first electrode layer 202 is formed of Ti, and the second resistive-switching layer 206 may be formed of $Ta_2O_5$ when the second electrode layer 208 is formed of Ta. In another embodiment, the first resistive-switching layer 204 may be $Ta_2O_5$ when the first electrode layer 202 is formed of Ta, and the second resistive-switching layer 206 may be formed of $HfO_2$ when the second electrode layer 208 is formed of Hf. All of the materials of the various layers of the RRAM cell structure are widely used materials in the industry.

In an embodiment, the first resistive-switching layer 204 may be formed by directly oxidizing the outer portions of the first electrode layer 202. For example, the first resistive-switching layer 204 may be oxidized from the first electrode layer 202 by thermal oxidation or laser oxidation. In other embodiments, the first resistive-switching layer 204 may be formed by any suitable depositing method, such as atom layer deposition (ALD), chemical vapor deposition (CVD), plasma enhanced chemical vapor deposition (PECVD), metal-organic vapor deposition (MOCVD), physical vapor deposition (PVD) or other suitable depositing methods. The second resistive-switching layer 206 may be formed only by a suitable depositing method, such atom layer deposition (ALD), chemical vapor deposition (CVD), plasma enhanced chemical vapor deposition (PECVD), metal-organic vapor deposition (MOCVD) or physical vapor deposition (PVD) since the second resistive-switching layer 206 is formed prior to the second electrode layer 208. In some embodiments, the first resistive-switching layer 204 may have a thickness of between about 1 and about 80 nm. The second resistive-switching layer 206 may have a thickness of between about 1 and about 80 nm.

The RRAM cell structure may be a bipolar resistive-switching cell structure. The RRAM cell structure may be placed to a set state by applying a minimum non-negative bias voltage of 1 V, and it may be placed to a reset state by applying a minimum negative bias voltage of −1 V.

Furthermore, the RRAM cell structure may be self-compliance and self-rectifying. The current is rectified at the positive polarity and the sneak current is greatly suppressed. For example, the RRAM cell structure of the present disclosure may have a current compliance limit level of less than about $10^{-4}$. The RRAM cell structure may have a current rectification ratio (i.e., the ratio of the current compliance limit level to the rectification current level) of greater than $10^5$ at ±2 V of bias voltage. In some embodiments, the current toward the second electrode layer 208 may be rectified by the second resistive-switching layer 206 when the current flows thereto since the second resistive-switching layer 206 has a higher bandgap than that of the first resistive-switching layer 204. The current toward the first electrode layer 202 may easily pass through the first resistive-switching layer 204.

Therefore, the RRAM cell structure according to the present disclosure is merely a 1R cell structure and can perform similar properties similar to a conventional resistor connected to a unidirectional selector such as the 1T1R, 1D1R, 1S1R and 1BJT1R RRAM cell structures. In addition, the RRAM cell structure is forming-free. The RRAM cell structure may be activated without applying an initial forming voltage. The initial forming voltage may sometimes damage the RRAM cell structure due to its high magnitude. The forming-free RRAM cell structure therefore can have a better reliability.

Figure 3:
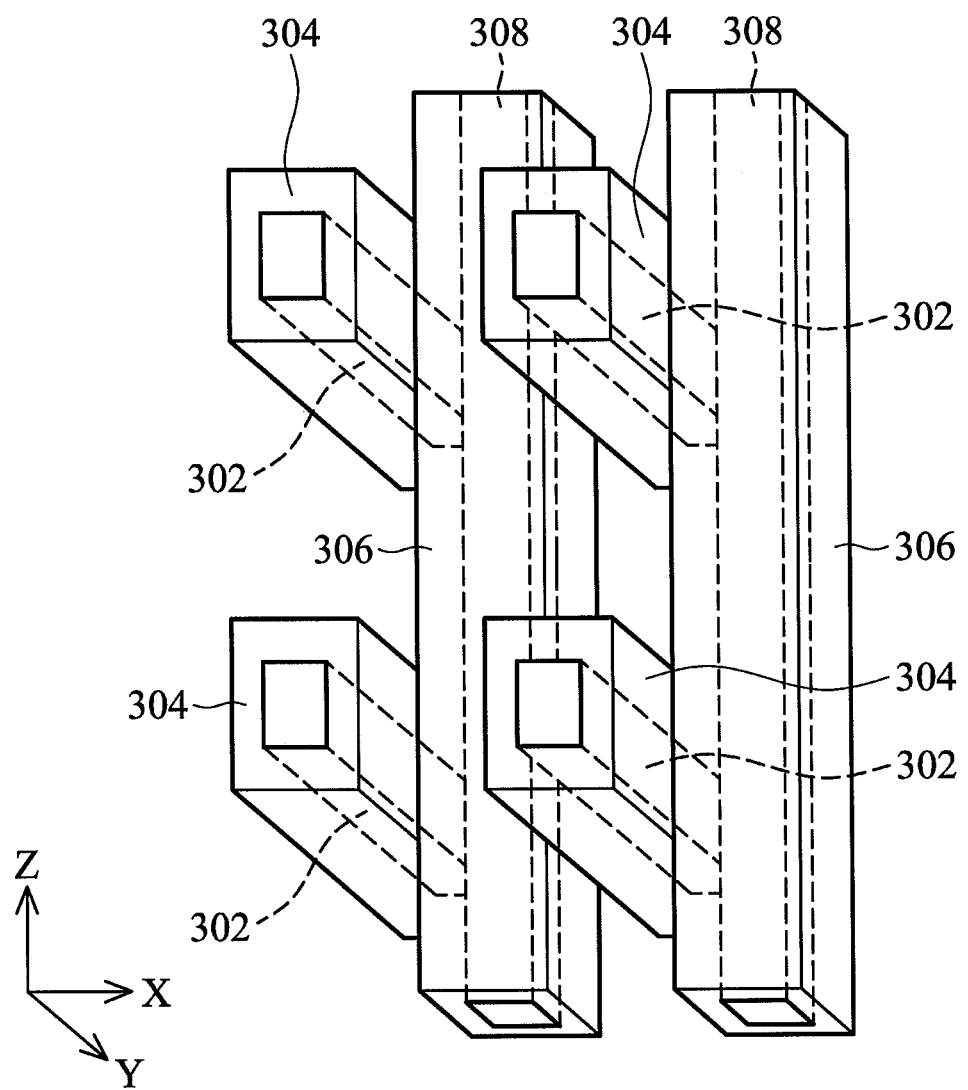
FIG. 3 shows an exemplary scheme of an application of the RRAM cell structure for the 3D crossbar array architecture according to an embodiment of the present disclosure.

FIG. 3 shows an exemplary scheme of an application of the RRAM cell structure for the 3D crossbar array architecture according to an embodiment of the present disclosure. The 3D cross bar array architecture may comprise a group of horizontal parallel conductive lines 302 (e.g., extending along the Y longitude of FIG. 3), and a group of vertical parallel conductive lines 308 (e.g., extending along the Z longitude of FIG. 3). An array of the RRAM cell structures is formed between the intersections of the group of the horizontal conductive lines 302 and the group of the vertical conductive lines 308. Each of the RRAM cell structures may be disposed along a horizontal direction (e.g., extending along the X longitude of FIG. 3) perpendicular to the extending directions of the group of the horizontal conductive lines 302 and the group of the vertical conductive lines 308.

In an embodiment, the group of the horizontal parallel conductive lines 302 may be used as the first electrode layer of the RRAM cell structures, and the group of the vertical parallel conductive lines 308 may be used as the second electrode layer of the RRAM cell structures. The group of the horizontal parallel conductive lines 302 and the group of vertical parallel conductive lines 308 may be respectively formed of the same or similar materials of the first electrode layer 202 and the second electrode layer 208 described in the above embodiments. Alternatively, the group of the horizontal parallel conductive lines 302 and the group of vertical parallel conductive lines 308 may be respectively formed of the same or similar materials of the second electrode layer 208 and the first electrode layer 202 described in the above embodiments. In an embodiment, the group of the horizontal conductive lines 302 may be a bit line, and the group of the vertical conductive lines 308 may be a word line, or vice versa.

The first resistive-switching layer 304 may be formed on and wrap around sidewalls of the group of the horizontal conductive lines 302, and the second resistive-switching layer 306 may be formed on and wrap around sidewalls of the group of the vertical conductive lines 308. In other words, each of the RRAM cell structures is formed at the locations where the first resistive-switching layer 304 and the second resistive-switching layer 306 are in direct contact with each other. In an embodiment, the first resistive-switching layer 304 and the second resistive-switching layer 306 may be respectively formed of the same or similar materials as the first resistive-switching layer 204 and the second resistive-switching layer 206 described in the above embodiments. Alternatively, the first resistive-switching layer 304 and the second resistive-switching layer 306 may be respectively formed of the same or similar materials as the second resistive-switching layer 206 and the first resistive-switching layer 204 described in the above embodiments. In some embodiments, the RRAM cell structure for the 3D crossbar array architecture is formed within a semiconductor substrate.

As shown in FIG. 3, the RRAM 3D crossbar array architecture only includes 1R cell structures. Therefore, the RRAM 3D crossbar array architecture may be fabricated easily since the 1R cell structures require no inter-metal layer. The problems of sneak current occurred in conventional 1R cell structures of RRAM 3D crossbar array may be overcome because the 1R cell structures of the present disclosure may be self-compliance and self-rectifying. The RRAM 3D crossbar array architecture according to present disclosure may be used as a next generation nonvolatile memory and has great potential to replace flash memory devices.

Figure 4:
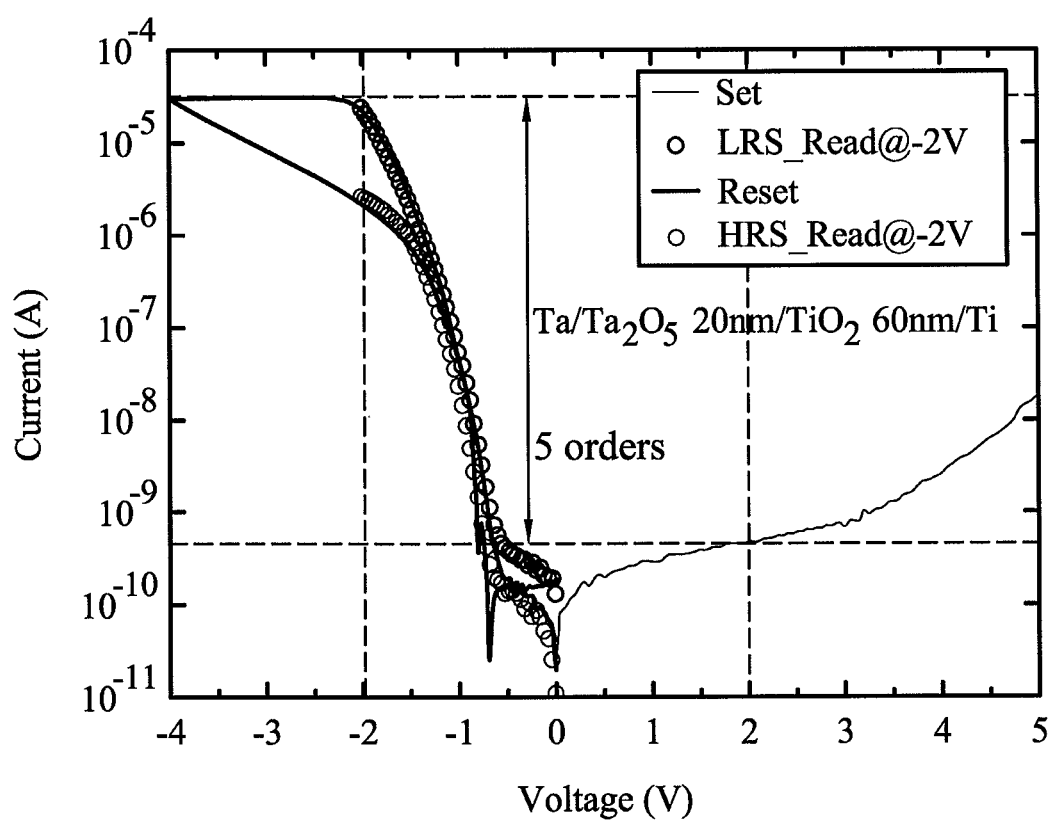
FIG. 4 shows a current-versus-voltage diagram of the RRAM according to an embodiment of the present disclosure.

FIG. 4 shows a current-versus-voltage diagram of the RRAM according to an embodiment of the present disclosure. In this embodiment shown in FIG. 2, the RRAM was formed of a Ti electrode, a $TiO_2$ layer, a $Ta_2O_5$ layer and a Ta electrode which are stacked in order, wherein the $TiO_2$ layer had a thickness of 60 nm, and the $Ta_2O_5$ layer had a thickness of 20 nm.

As shown in FIG. 4, the RRAM clearly shows self-rectification characteristics. In addition, the RRAM may be placed at a set state by applying a positive voltage, and a reset state by applying a negative voltage, which shows that the RRAM according to the present disclosure is a bipolar resistive-switching RRAM. The RRAM can be placed to the set state and the reset state by a minimum voltage of about +5 V and −4V, respectively (+/−2 V was used to read not to set/reset the device). It can also be found that the current was limited to a range of between $10^{-4}$ and $10^{-5}$ A when the negative bias voltage was increased, even to −4V.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A self-rectifying RRAM cell structure, comprising
a first electrode layer formed of a first metal element;
a second electrode layer formed of a second metal element different from the first metal element; and
a first resistive-switching layer and a second resistive-switching layer sandwiched between the first electrode layer and the second electrode layer, wherein the first resistive-switching layer and the second switching layer form an ohmic contact, and the first resistive-switching layer has a first bandgap lower than a second bandgap of the second resistive-switching layer.

2. The self-rectifying RRAM cell structure as claimed in claim 1, wherein the first resistive-switching layer is formed of an oxide of the first metal element, and the second resistive-switching layer is formed of an oxide of the second metal element.

3. The self-rectifying RRAM cell structure as claimed in claim 2, wherein the first resistive-switching layer is a thermal oxidized product or a laser oxidized product of the first electrode layer.

4. The self-rectifying RRAM cell structure as claimed in claim 3, wherein the first metal element and the second metal element are selected from a group consisting of Ti, Ta, Ni, Cu, W, Hf, Zr, Nb, Y, Zn, Co, Al, Si, Ge and their alloys.

5. The self-rectifying RRAM cell structure as claimed in claim 1, wherein the self-rectifying resistive-switching memory is a bipolar resistive-switching memory.

6. The self-rectifying RRAM cell structure as claimed in claim 1, wherein the second bandgap is higher than the first bandgap by more than about 0.5 eV.

7. The self-rectifying RRAM cell structure as claimed in claim 1, wherein the first resistive-switching layer has a thickness of between about 1 and about 80 nm.

8. The self-rectifying RRAM cell structure as claimed in claim 1, wherein the second resistive-switching layer has a thickness of between about 1 and about 80 nm.

9. The self-rectifying RRAM cell structure as claimed in claim 1, wherein the first electrode layer is formed of Ti, and the second electrode layer is formed of Ta.

10. An RRAM 3D crossbar array architecture, comprising:
a group of vertical parallel conductive lines formed of a first metal element;
a group of horizontal parallel conducive lines formed of a second metal element different from the first metal element;
a first resistive-switching layer formed on sidewalls of the group of vertical parallel conductive lines; and
a second resistive-switching layer formed on sidewalls of the group of vertical parallel conductive lines, wherein the first resistive-switching layer and the second resistive-switching layer form ohmic contacts at the intersections of the group of vertical parallel conductive lines and the group of horizontal parallel conducive lines, and the first resistive-switching layer has a first bandgap lower than a second bandgap of the second resistive-switching layer.

11. The RRAM 3D crossbar array architecture as claimed in claim 10, wherein the first resistive-switching layer is formed of an oxide of the first metal element, and the second resistive-switching layer is formed of an oxide of the second metal element.

12. The RRAM 3D crossbar array architecture as claimed in claim 11, wherein the first resistive-switching layer is a thermal oxidized product.

13. The RRAM 3D crossbar array architecture as claimed in claim 10, wherein the first metal element and the second metal element are selected from a group consisting of Ti, Ta, Ni, Cu, W, Hf, Zr, Nb, Y, Zn, Co, Al, Si, Ge and their alloys.

14. The RRAM 3D crossbar array architecture as claimed in claim 10, wherein the second bandgap is higher than the first bandgap by more than about 0.5 eV.

15. The RRAM 3D crossbar array architecture as claimed in claim 10, wherein the group of horizontal parallel conductive lines is bit lines, and the group of vertical parallel conductive lines is word lines.

16. The RRAM 3D crossbar array architecture as claimed in claim 10, wherein the group of horizontal parallel conductive lines is word lines, and the group of vertical parallel conductive lines is bit lines.

17. The RRAM 3D crossbar array architecture as claimed in claim 10, wherein the first resistive-switching layer wraps around the sidewalls of the group of vertical parallel conductive lines, and the second resistive-switching layer wraps around the sidewalls of the group of horizontal parallel conductive lines.

18. The RRAM 3D crossbar array architecture as claimed in claim 10, wherein the first metal element is Ti, and the second metal element is Ta.

* * * * *